United States Patent Office 3,674,494

Patented July 4, 1972

3,674,494

REFLECTIVE METAL PLATE WITH PHOTO-POLYMERIZABLE LAYER CONTAINING METAL COMPLEX DYE

Horst Hoffmann, Ludwigshafen, Carl Heinrich Krauch, Heidelberg, and Hans-Werner Otto and Otto Volkert, Ludwigshafen, Germany, assignors to Badische Anilin- & Soda-Fabrik Aktiengesellschaft, Ludwigshafen (Rhine), Germany No Drawing. Filed Jan. 27, 1970, Ser. No. 6,301

Claims priority, application Germany, Feb. 1, 1969, P 19 05 012.5

Int. Cl. G03c *1/68, 1/70*

U.S. Cl. 96—86 P 6 Claims

ABSTRACT OF THE DISCLOSURE

Improved relief plates, particularly printing plates, prepared by exposing under an image-bearing transparency a layer, which can be crosslinked by exposure and has been applied to a light-reflecting substrate of a substantially homogeneous mixture of solid polymers, monomers, photoinitiators and, if desired, polymerization inhibitors, which mixture also contains finely dispersed therein a soluble metal complex dye, and washing out the unexposed areas.

This invention relates to a process for the production of relief plates, particularly printing plates, in which plates, sheets or films of a polymeric base material containing photopolymerizable olefinically unsaturated compounds, metal complex dyes, photoinitiators, and, if desired, polymerization inhibitors, are applied to a substrate, exposed through an image-bearing transparency and then washed out at the unexposed areas by means of solvents down to the desired depth.

It is already known that relief plates can be prepared by exposing through an image-bearing transparency plates or sheets of mixtures of highly polymerized substances with olefinically unsaturatde monomers most of which contain more than one polymerizable double bond and photoinitiators, and removing the unexposed areas by means of suitable solvents down to the desired depth. These plates are suitable for letterpress and dry offset printing.

It is also known that layers, such as plates, sheets or films, of linear saturated synthetic polyamides which are soluble particularly in alcoholic solvents, monomers most of which contain more than one polymerizable olefinic double bond and photoinitiators can be used for the production of relief plates.

To prepare plates having the mechanical stability required for printing, photosensitive layers of photopolymerizable monomers and highly polymerized substances have been applied to supports, particularly metal plates. The metal plates are provided with an antihalation coating by the process described in U.S. patent specification No. 2,760,863 to prevent light reflected by the base from initiating an unwanted polymerization reaction in the photosensitive layer. In the production of printing plates particular importance is attached to the shape of the shoulders. The difficulties encountered in the case of conventional photopolymerization in the production of steep shoulders are dealt with at length for example in U.S. patent specification No. 2,760,863. Photosensitive films or sheets laminated to metal plates accordingly give, in the production of printing plates, broadened shoulders as well as supporting bases of polymer which are much too wide because light reflected at the metal plate, as already mentioned, also initiates polymerization reactions within areas of the photosensitive plates covered by the portions of the image-bearing transparency which are opaque. For this reason the application of a colored lacquer which absorbs incident light to the metal plate serving as base is recommended in the abovementioned U.S. patent specification.

Even this does not solve the problem of providing the shoulders and supporting bases of polymer of the printing relief with a favorable shape. Naturally the area of the photosensitive layer exposed to the light source is first impinged upon by all the light quanta emitted, the stream of quanta decreasing downwardly within the layer corresponding to their absorptivities. This means that the photopolymer layer is cured best at its surface while the material in the lower layers of the plate remains to a certain extent soluble even at the exposed areas. In the following development process in which areas which have not been photopolymerized are washed out, undercutting of the supporing bases of polymer readily takes place so that their rigidity suffers. U.S. patent specification No. 2,964,401 therefore recommends the production of photopolymerizable layers consisting of a plurality of thin films which differ in the concentration of the photoinitiator. The layers farthest from the incident light contain the highest concentration of photoinitiator in order that satisfactory curing may be achieved at the exposed areas. Photopolymerizable plates of this type have however not proved to be very suitable in practice for the production of printing plates. The application of the different layers is unusually complicated as regards the tolerance on thickness required for printing plates. Moreover, the mechanical properties of printing plates made from the said plates are unsatisfactory and this becomes evident for example in separation of the individual layers when such plates are used for printing.

We have now found that the production of relief plates, particularly printing plates, by exposing, under an image-bearing transparency, layers applied to light-reflecting substrates and based on solid soluble polymers, monomers most of which contain more than one photopolymerizable olefinic double bond, photoinitiators and, if desired, polymerization inhibitors, and washing out the unexposed areas with a solvent for the unexposed mixture down to the desired depth can be carried out particularly advantageously while substantially avoiding the said disadvantages by using photopolymerizable layers which contain uniformly dispersed therein a soluble metal complex dye. The dye is advantageously used in an amount of 0.001 to 5.0% by weight with reference to the weight of the mixture of polymers and monomers.

The invention also relates to solid photopolymerizable elements, particularly plates, sheets or films, that are suitable for the production of images or printing plates by exposure under an image-bearing transparency and washing out the unexposed areas, that are based on a substantially homogeneous mixture of solid soluble polymers, preferably linear synthetic polyamides, monomers most of which contain more than one photopolymerizable olefinic double bond, photoinitiators and, if desired, polymerization inhibitors, that contain a soluble metal complex dye and preferably have a light-reflecting substrate.

The reliefs prepared according to the invention or prepared from articles according to the invention by exposure under an image-bearing transparency and subsequent washing out of the unexposed areas are distinguished by a very favorable shoulder shape and exhibit very good stability when subjected to mechanical stress, for example when used for printing purposes.

Particularly suitable metal complex dyes to be used according to the invention in the solid, uniform, photosensitive or photopolymerizable layer which is preferably not or only slightly tacky even when heated to a temperature of for example 50° to 60° C. are organic-solvent-soluble metal complex dyes and phthalocyanine dyes which are generally referred to in the Color Index as solvent dyes. The metal complex dyes are preferably 1:1 or 1:2 complexes of azo or azomethine dyes having o-carboxy-o'-hydroxy or o-amino-o'-hydroxy groups, particularly o,o'-dihydroxy groups. Particularly suitable metals are chromium and cobalt. Suitable dyes are described for example in British patent specification Nos. 944,409 and 981,050. Preferred phthalocyanines are copper-containing compounds.

Specific examples of dyes are as follows (the numbers in the brackets correspond to the numbers of the dyes used in the examples): The cobalt or chromium complexes of azo dyes of 4- or 5-nitro-2-aminophenol or 4-chloro-2-aminophenol-6-sulfonic acid and $\beta$-naphthol, e.g. dyes having Color Index Nos. 12,196 (No. 1), 15,680 (No. 2) and 12,195 (No. 5), the 1:2 chromium mixed complex of azo dyes of 0.5 mole each of 4-nitro-2-aminophenol and 5-nitro-2-aminophenol and 1 mole of $\beta$-naphthol (No. 3), dyes having Color Index Nos. 12,050 (No. 4) and 15,951 (No. 6), the 1:2 cobalt mixed complex of azo dyes of 1 mole each of 4-nitro-2-aminophenol and 5-nitro-2-aminophenol and 1 mole each of 1-phenyl-3-methyl-5-pyrazolone and $\beta$-naphthol (No. 7), the similar chromium complex dyes having Color Index Nos. 12,716 (No. 8) and 12,715 (No. 9), the 1:1 chromium complex of the dye of 2-amino-1-methoxybenzene-4-sulfodiethylamide and 2,4-dihydroxyquinoline (No. 10), the metal complex dyes having Color Index Nos. 15,675 (No. 11), 18,745 A (No. 12) and 18,736 A (No. 13), the 1:1 chromium complex of the azo dye of 2-aminophenol - 4 - sulfamide and 1-m-sulfaminophenyl-3-methyl-5-pyrazolone (No. 14), the 1:2 chromium mixed complex of azo dyes of 0.5 mole each of 4-nitro-2-aminophenol and anthranilic acid and 1 mole of 1-phenyl-3-methyl-5-pyrazolone (No. 15), the 1:2 chromium complex of the azo dye of 1-amino-2-naphthol-4-sulfonic acid and 1-m-sulfaminophenyl-3-methyl - 5 - pyrazolone (No. 16), the cobalt and chromium complexes of dyes of acetoacetanilide and 4-nitro-2-aminophenol or 4-nitro-2-aminophenol-6-sulfonic acid or of anthranilic acid and 1-phenyl-3-methyl-5-pyrazolone having Color Index Nos. 11,700 (No. 17), 18,690 (No. 18) and 13,900 A (No. 19), the 1:1 chromium complex of the azomethine dye of 4-nitro-2-aminophenol-6-sulfonic acid and 2-hydroxybenzaldehyde having Color Index No. 48,045 (No. 20), the copper phthalocyanine dye CnPc $[SO_2N(C_4H_9)_2]2$–3, tetraphenyl copper phthalocyanine having at least 3 sulfoisohexylamide groups and sulfo groups in the form of the isohexylamine salt (No. 21), acid salts of copper phthalocyanine trisulfonic acid with palm oil dimethylamine having Color Index No. 74,380 (No. 22), the dibutylamine and isohexylamine salts of copper phthalocyanine dyes having Color Index No. 74,350 (No. 23), and the 1:2 chromium complex of the azo dye of $\alpha$-naphthol and 1-amino-2-naphthol-4-sulfonic acid having Color Index No. 14,641 (No. 24).

The amount of dye added to the mixture of polymers and monomers depends to a considerable extent on the former's absorptivity. Generally about 0.001 to 5%, advantageously 0.005 to 1%, preferably 0.01 to 0.5%, by weight (based on the weight of the mixture of polymers and monomers) of dye is used. As a rule the dye should not have a marked absorption gap in the range of absorption of the photoinitiator in the layer and thus be without influence on photopolymerization, but rather should take part in it and consequently influence the shoulder shape. The dye may be added to the mixture in a conventional manner either as a pure substance or in the form of a solution of the dye in a suitable solvent, e.g. alcohols, glycols and ketones, which is often advantageous.

All solid synthetic and semi-synthetic polymers which are soluble in solvents and are conventionally used for the production of photopolymerizable layers, particularly printing plates, are suitable as polymers (the base material) for the production of the photosensitive layers, such as plates, sheets or films, e.g. the polymers given in U.S. patent specification No. 2,760,863. Examples are vinyl polymers, such as polyvinyl chloride, vinylidene chloride polymers, copolymers of vinyl chloride and vinyl esters of monocarboxylic acids and/or vinyl alcohol, polymers of predominant amounts of olefinic unsaturated carboxylic acids having 3 to 5 carbon atoms and/or esters and/or amides thereof, e.g. of acrylic acid, methacrylic acid and esters thereof with alkanols having 1 to 12 carbon atoms, acrylamide or methacrylamide. Polymers based on styrene or vinyl esters of monocarboxylic acids having 2 to 11 carbon atoms, such as vinyl acetate and vinyl chloroacetate, are suitable. Further examples are polymers based on acrylic and methacrylic esters of aliphatic diols and polyols, such as ethylene glycol, 1,4-butanediol and glycerol. Finally, soluble cellulose derivatives, polyesters and polyethers may also be used.

Particularly suitable polymers are linear synthetic polyamides which have recurring amide groups in the main chain of the molecule and are soluble in conventional organic, particularly alcoholic, solvents. Of these, copolyamides are preferred which are soluble in conventional solvents or solvent mixtures, such as lower aliphatic alcohols, mixtures of alcohol and water or mixtures of alcohols with other solvents, e.g. mixtures of benzene, alcohol and water, ketones, esters or aromatic hydrocarbons. Examples of these are copolyamides which have been prepared by a conventional method by polycondensation or polymerization, e.g. activated anionic polymerization, from two or more lactams having five to thirteen ring members. Examples of such lactams are pyrrolidone, caprolactam, enantholactam, capryllactam, laurolactam or equivalent carbon-substituted lactams, such as C-methyl-epsilon-caprolactam, epsilon-ethyl-epsilon - caprolactam or o-ethylenantholactam. The aminocarboxylic acids on which the lactams are based may be polycondensed instead of the lactams. Further suitable copolyamides are polycondensation products of salts of the diamine/dicarboxylic acid type which have been prepared from at least three polyamide-forming starting materials. Preferred dicarboxylic acids and diamines for this purpose are aliphatic dicarboxylic acids having 4 to 20 carbon atoms, such as adipic acid, suberic acid, sebacic acid, dodecanedicarboxylic acid, and equivalent substitution products, such as $\alpha,\alpha$-diethyladipic acid, $\alpha$-ethylsuberic acid, octanedicarboxylic acid, heptadecanedicarboxylic acid-(1,8) or heptadecanedicarboxylic acid-(1,9) or mixtures thereof as well as dicarboxylic acids containing aliphatic or aromatic ring systems. Particularly suitable diamines are aliphatic or cycloaliphatic diamines having 2 primary and/or secondary amino groups, such as pentamethylenediamine, hexamethylenediamine, heptamethylenediamine, octamethylenediamine or carbon-substituted and/or nitrogen-substituted derivatives of these amines, such as N-methyl - N - ethylhexamethylenediamine, 1,6-diamino-4-methylhexane, 4,4'-diaminodicyclohexylmethane and 4,4'-diaminodicyclohexylpropane, as well as aromatic diamines, such as m-phenylenediamine, m-xylylenediamine and 4,4'-diaminodiphenylmethane, the bridging groups between the two carboxylic acid groups or amino groups being optionally interrupted by heteroatoms, e.g. oxygen, nitrogen or sulfur atoms. Particularly suitable copolyamides are those which have been prepared by cocondensation of a mixture of one or more lactams, particularly caprolactam, and at least one salt of a dicarboxylic acid and a diamine, e.g. epsilon-caprolactam, hexamethylenediammonium adipate and 4,4'-diaminodicyclohexylmethane adipate.

Suitable monomers are compounds having photopolymerizable olefinically unsaturated double bonds at least 20 to 50% by weight of which are compatible with the polymers used. The predominant amount of the monomers used, preferably 70 to 100% by weight of the total weight of the monomers used, should contain more than one photopolymerizable olefinic double bond. Examples of very suitable monomers containing at least two polymerizable olefinic double bonds which can be used particularly advantageously in admixture with linear soluble polyamides are those which contain amide groups in addition to the double bonds, such as amides derived from acrylic acid and/or methacrylic acid. Examples are alkylenedisacrylamides, alkylenebismethacrylamides, such as methylenebisacrylamide, methylenebismethacrylamide, and the bisacrylamides and bismethacrylamide of aliphatic, cycloaliphatic and aromatic diamines or polyamines having 2 to 12 carbon atoms, such as ethylenediamine, propylenediamine, butylenediamine, pentamethylenediamine, hexamethylenediamine, heptamethylenediamine, octamethylenediamine, xylylenediamine, and of polyamines and other diamines which may be branched or interrupted by heteroatoms, such as oxygen, nitrogen or sulfur atoms. Diethers of 1 mole of an aliphatic diol or polyol and 2 moles of N-methylolacrylamide or N-methylolmethacrylamide are very suitable. Photopolymerizable monomers which contain methane or urea groups in addition to amide groups are also very suitable, such as the reaction products of monoacrylates or monomethacrylates of aliphatic diols with diisocyanates or the equivalent reaction products of monoacrylamides or monomethacrylamides of diamines with diisocyanates. Among monomers containing nitrogen the following are suitable: triacrylic formal or triallyl cyanurate. Diacrylates, dimethacrylates, triacrylates, trimethacrylates, tetraacrylates or tetramethacrylates of dihydric or polyhydric alcohols and phenols, e.g., diethylene glycol diacrylate, diethylene glycol dimethacrylate, triethylene glycol diacrylate and triethylene glycol dimethylacrylate, may also be used. The use of bifunctional or polyfunctional polymerizable monomers is however not limited to the choice given above. It also includes other monomers having at least two polymerizable double bonds provided these are compatible to the extent of at least 20 to 50% with the said copolyamides; this can be established easily by simple experiment.

A minor amount, preferably less than 30% by weight of the total amount of the monomers, of monomers having only one polymerizable olefinic double bond, such as aromatic hydrocarbons, e.g. styrene or vinyltoluene, acrylamides, methacrylamides or substitution products thereof, such as N-methylolacrylamide and N-methylolmethacrylamide, or ethers or esters thereof or monoesters of olefinically unsaturated carboxylic acids having 3 to 5 carbon atoms and aliphatic diols or polyols, e.g. monoacrylates or monomethacrylates of ethylene glycol, diethylene glycol, triethylene glycol, glycerol, 1,1,1-trimethylolpropane and 1,4-butanediol, may be used instead of the monomers having more than one polymerizable olefinic double bond. With regard to the choice of monomers the above criteria apply; their choice also depends on the application of the photosensitive or curable mixtures.

Very suitable photopolymerizable or curable mixtures contain in substantially uniform distribution 10 to 50%, particularly 20 to 40%, by weight of monomers and 90 to 50%, particularly 80 to 60%, by weight of solid polymers, such as soluble polyamides. Preferred mixtures are solid and not or only slightly tacky even when heated to elevated temperatures, e.g. 50° to 60° C.

Particularly suitable photoinitiators are compounds which decompose into radicals under the action of light or radiation and start polymerization of the monomers, for example vicinal ketaldonyl compounds, such as diacetyl, benzil; α-ketaldonyl alcohols, such as benzoin; acyloin ethers, such as benzoin methyl ether or benzoin isopropyl ether; α-substituted aromatic acyloins, such as α-methylbenzoin. The photoinitiators are used in the usual amounts, advantageously in amounts of from 0.01 to 10%, preferably 0.01 to 3%, by weight with reference to the whole mixture.

Suitable polymerization inhibitors are conventional thermal polymerization inhibitors, such as hydroquinone, p-methoxyphenol, p-quinone, copper(I) chloride, methylene blue, β-naphthol, phenols and salts of N-nitrosocyclohexylhydroxylamine. The polymerization inhibitors are usually used in amounts of from 0.01 to 2.0%, preferably from 0.05 to 0.5%, by weight with reference to the whole mixture.

Examples of suitable support materials are wood, paper materials, plastics sheeting or film or wooden, paper or plastics sheets laminated with plastics sheeting or film, plastics sheets reinforced with glass fibers or wire, textile materials which may be laminated with plastics or metal foils, sheets of glass unlaminated or laminated as above, sheet metal of all types, particularly materials which have been roughened electrolytically or mechanically.

The process according to this invention is particularly advantageous as compared with conventional processes when highly reflective substrates, supports or layers are used under the photopolymerizable layer. Examples of such substrates are those which or whose surface consists of highly reflective spherules, transparent materials or materials having a metallic luster. Polished or roughened metal surfaces or metal dust embedded in plastics sheeting are also suitable. It is advantageous to use reflective painted substrates, particularly substrates which have been coated with paints pigmented with conventional white pigments, such as titanium dioxide, zinc oxide and magnesium oxide; the paint may be one which dries physically or one which cures chemically. By highly reflective substrates we mean substrates which reflect light, particularly the light of the light source used for exposure, to the extent of more than 40%, preferably to the extent of at least 50%. The reflectances are measured with a universal reflectometer (calibrated against a standard black sheet (0% reflectance) and a standard white sheet (100% reflectance)) at wavelengths starting from 420 millimicrons.

The layers containing the photopolymerizable monomers and polymers and the metal complex dyes according to this invention may be prepared by conventional methods, advantageously by dissolving the components, removing the solvent, followed by molding, extrusion or rolling of the finely dispersed mixture. The solutions of the components may also be cast into sheets of films. The dyes are preferably added to the solution of the components prior to the processing of the same into photosensitive layers, but they may be added to the finished mixture immediately prior to the production of the photosensitive layers. In any case care should be taken to ensure that the dye is uniformly dispersed in the layer.

Conventional light sources, particularly high-energy lamps, such as carbon arc lamps, mercury vapor lamps, xenon lamps and fluorescent tubes, are used for exposure. Lamps which emit a high proportion of ultraviolet light, such as mercury vapor lamps and fluorescent tubes, are preferred.

The invention is illustrated by the following examples in which parts and percentages are by weight except the reflectance percentages.

EXAMPLE 1

The dyes given in the following table are added in the specified amounts of from 0.01 to 0.05 part to a solution of 100 parts of a polyamide, which is soluble in aqueous alcohol, of approximately equal parts of hexamethylenediamine adipate, 4,4′-diaminodicyclohexylmethane adipate and epsilon-caprolactam, 20 parts of m-xylylenebisacrylamide, 8 parts of triethylene glycol bisacrylate, 22 parts of the diether of 1 mole of ethylene glycol and 2 moles of N-methylolacrylamide, 1 part of benzoin methyl ether and 0.1 part of the cyclohexylammonium salt of N-nitrosocyclohexylhydroxylamine. The solutions are cast into films, dried and pressed onto base plates of the same type coated with polyurethane paint filled with chromium oxide and titanium oxide (reflectance at least 50%).

The finished photosensitive plates are exposed for varying lengths of time in contact with a negative. Fluorescent tubes emitting a high proportion of ultraviolet light and situated at a distance of 3 cm. from the plate to be exposed are used as the light source. After exposure, the unexposed areas of the plate are dissolved out with a mixture of 63% of ethanol, 21% of n-propanol and 16% of water. The printing plates obtained after drying exhibit a sharp relief image and have the stabilities desired for printing. The dyes used are designated by the numbers given in the preceding description.

TABLE 1

| Dye No. | Amount (in parts) | Exposure limit (in minutes) Lower | Upper |
|---|---|---|---|
| 1 | 0.025 | 4 | 8 |
| | 0.04 | 6 | 10 |
| 2 | 0.025 | 4 | 8 |
| 3 | 0.025 | 4 | 8 |
| 4 | 0.025 | 3 | 8 |
| | 0.04 | 4 | 10 |
| 5 | 0.025 | 6 | 10 |
| | 0.01 | 3 | 6 |
| 6 | 0.04 | 4 | 8 |
| 7 | 0.025 | 8 | 12 |
| | 0.01 | 3 | 8 |
| 8 | 0.025 | 4 | 8 |
| | 0.04 | 3 | 10 |
| 9 | 0.025 | 3 | 6 |
| | 0.04 | 5 | 10 |
| 10 | 0.025 | 4 | 8 |
| 11 | 0.025 | 4 | 8 |
| | 0.04 | 3 | 8 |
| 12 | 0.025 | 4 | 8 |
| | 0.04 | 6 | 10 |
| 13 | 0.025 | 3 | 8 |
| | 0.04 | 4 | 8 |
| 14 | 0.025 | 3 | 6 |
| 15 | 0.025 | 3 | 8 |
| 16 | 0.025 | 3 | 6 |
| 17 | 0.025 | 4 | 8 |
| | 0.04 | 6 | 10 |
| 18 | 0.025 | 4 | 6 |
| | 0.05 | 6 | 10 |
| 19 | 0.025 | 4 | 8 |
| | 0.05 | 5 | 10 |
| 20 | 0.025 | 4 | 8 |
| | 0.04 | 6 | 10 |
| 21 | 0.025 | 4 | 6 |
| 22 | 0.025 | 4 | 8 |
| 23 | 0.025 | 5 | 8 |
| 24 | 0.025 | 3 | 8 |
| | 0.04 | 4 | 10 |

EXAMPLE 2

The abovementioned dyes having the numbers given in Table 2 are added in the specified amounts of from 0.02 to 0.04 part to a solution of 100 parts of the polyamide used in Example 1, 37 parts of the diether of 1 mole of ethylene glycol and 2 moles of N-methylolacrylamide, 1 part of benzoin isopropyl ether and 0.1 part of the cyclohexylammonium salt of N-nitrosocyclohexylhydroxylamine. The solutions are concentrated in an evaporator, cast into films, dried and then laminated onto base plates coated with reflective paint (reflectance at least 50%). The photosensitive plates are exposed and washed out as described in Example 1. The resultant printing plates have a very sharp relief image at the exposure times within the specified range.

TABLE 2

| Dye No. | Amount (in parts) | Exposure limit (in minutes) Lower | Upper |
|---|---|---|---|
| 1 | 0.04 | 10 | 16 |
| | 0.02 | 10 | 14 |
| 13 | 0.025 | 8 | 16 |
| 24 | 0.04 | 10 | 20 |
| | 0.03 | 10 | 18 |
| 8 | 0.04 | 10 | 20 |
| 11 | 0.04 | 10 | 18 |

COMPARATIVE EXPERIMENTS

Plates are prepared according to the above examples but without the addition of metal complex dyes. When similarly exposed on highly reflective substrates and washed out, completely useless relief plates are obtained which exhibit extensive crosslinking of the unexposed areas.

We claim:

1. A plate for producing a relief printing plate which comprises:
   (a) a substantially homogeneous photopolymerizable layer comprising a mixture of
      (1) a synthetic polymer;
      (2) a photopolymerizable monomer having at least two polymerizable olefinic double bonds;
      (3) 0.01 to 10% by weight, with reference to the mixture of a photoinitiator; and
      (4) 0.001 to 5.0% by weight with reference to the total weight of the mixture of polymers and monomers of a soluble complex dye containing cobalt, chromium or copper as the complexing metal, said dye being capable of absorption of incident light in the range of absorption of said photoinitiator; and
   (b) a support for said layer, said support having a surface which reflects incident light to the extent of more than 40%.

2. A plate as in claim 1 wherein the surface of said support reflects incident light to the extent of at least 50%.

3. A plate as in claim 1 wherein said synthetic polymer is a polyamide.

4. A plate as in claim 1 wherein the soluble heavy metal complex dye contained in the layer is used in an amount of 0.005 to 1.0% by weight with reference to the total weight of the mixture of polymers and monomers.

5. A plate as in claim 6 wherein said support is a polished metal sheet.

6. A plate as in claim 1 wherein said complex dye is selected from the group consisting of (a) 1:1 or 1:2 complexes or mixed complexes of chromium or cobalt and an azo dye having a hydroxy group and (b) a copper phthalocyanine dye.

References Cited

UNITED STATES PATENTS

| | | | |
|---|---|---|---|
| 3,408,191 | 10/1968 | Jeffers | 96—35.1 X |
| 2,791,504 | 5/1957 | Plambeck | 96—115 X |
| 2,972,540 | 2/1961 | Saner et al. | 96—115 |
| 3,499,781 | 3/1970 | Krueckel | 96—115 |
| 2,500,023 | 3/1950 | Burk | 260—41 |

FOREIGN PATENTS

| | | | |
|---|---|---|---|
| 1,168,445 | 10/1969 | Great Britain | 96—115 |

RONALD H. SMITH, Primary Examiner

U.S. Cl. X.R.

96—35.1, 75, 115 P

PO-1050
(5/69)

UNITED STATES PATENT OFFICE
CERTIFICATE OF CORRECTION

Patent No. 3,674,494 Dated July 4, 1972

Inventor(s) Horst Hoffmann et al

It is certified that error appears in the above-identified patent and that said Letters Patent are hereby corrected as shown below:

Column 2, line 23, "supporing" should read -- supporting --.

Column 1, line 40, "unsaturatde" should read -- unsaturated --.

Column 4, line 48, "o-ethylenantholactam" should read -- $\delta$-ethylenantholactam --.

Column 5, line 19, "alkylenedisacryl-" should read -- alkylenebisacryl- --; line 22, "bismethacrylamide" should read -- bismethacrylamides --.

Column 7, Table 1, Dye no. 19, "5" should read -- 6 --.

Column 8, claim 5, "6" should read -- 1 --.

Signed and sealed this 27th day of February 1973.

(SEAL)
Attest:

EDWARD M.FLETCHER,JR.
Attesting Officer

ROBERT GOTTSCHALK
Commissioner of Patents